United States Patent [19]
Hou

[11] 3,990,024
[45] Nov. 2, 1976

[54] MICROSTRIP/STRIPLINE IMPEDANCE TRANSFORMER

[75] Inventor: Hsieh Sheng Hou, Rancho Palos Verdes, Calif.

[73] Assignee: Xerox Corporation, Stamford, Conn.

[22] Filed: Jan. 6, 1975

[21] Appl. No.: 538,643

[52] U.S. Cl. .............................. 333/33; 333/84 M
[51] Int. Cl.² .......................................... H01P 5/00
[58] Field of Search .................. 333/33, 84 M, 24.1

[56] References Cited
UNITED STATES PATENTS

| | | | |
|---|---|---|---|
| 3,289,115 | 11/1966 | Carr | 333/24.1 X |
| 3,691,485 | 9/1972 | Beck | 333/84 M X |
| 3,754,197 | 8/1973 | Cristal | 333/33 |

Primary Examiner—Paul L. Gensler
Attorney, Agent, or Firm—James J. Ralabate; Franklyn C. Weiss; Allen S. Melser

[57] ABSTRACT

To eliminate reflections and oscillations when a low impedance level circuit is to be connected to a high impedance level circuit on a printed circuit board, a microstrip/stripline impedance transformer is inserted in between. This transformer is passive and bi-directional, i.e., it can be step-up or step-down. It is made of a continuous folded microstrip (also called a surface etched line) or a continuous folded stripline (also called a buried etched line) wherein each folded section is run in parallel with its preceding one. Because of the mutual coupling between each section with its preceding one, the line impedance of each section will be step-up or step-down depending on the impedance levels at both ends of the interconnection.

16 Claims, 23 Drawing Figures

MICROSTRIP/STRIPLINE IMPEDANCE TRANSFORMER

BACKGROUND OF THE INVENTION

Printed circuit boards are widely used in almost every electronic field today. Because source circuits and load circuits may have different impedance levels, means must be found to match the impedance to eliminate unwanted reflections and oscillations in the interconnection. Specific impedance transformers can be inserted in the circuit where necessary, but in the use of printed circuit boards where cost and space are prime considerations, alternate solutions, such as, microstrip or stripline impedance transformers are viable and desirable alternatives. The prior art is deficient, however, in the area of providing impedance transformation for use on printed circuit boards as an efficient low cost adjunct to the use of microstrip/stripline impedance transformers. Discrete pulse transformers (e.g. baluns), and tapered lines are known to provide impedance matching effect but the tight spacing on a printed circuit board demands the ultimate conservation of both space and component value in accordance with the overall economics of a marketed item. It, therefore, becomes highly desirable to utilize stripline and microstrip impedance transformation in the most efficient manner possible for use in printed circuit boards in data processing, computing or other type of equipment.

OBJECTS OF THE INVENTION

It is, therefore, an object of the present invention to utilize stripline and microstrip impedance transformation for step-up and/or step-down impedance transformation.

It is another object of the present invention to utilize normally unusable space on a printed circuit board to provide impedance matching between source load circuits within the board itself.

It is another object of the present invention to provide for a continuous folded microstrip, i.e., a surface etched line, or a continuous folded stripline, i.e., buried etched line, on a printed circuit board wherein each section is run in parallel with the preceding section to provide as many impedance steps as necessary for the desired impedance matching effect.

SUMMARY OF THE INVENTION

The present application describes a microstrip/stripline transformer for use in the impedance matching of the various circuit elements on a printed circuit board. In a typical case, a signal source has a nominal output impedance of about 50 ohms, whereas a typical logic gate, for example, has an input impedance of about 1,500 ohms. Assuming an output step voltage waveform from the signal source that goes from 0 to 4 volts, the voltage seen at the input to the gate will be a wave shape that rises steeply from 0 volts to something greater than 4 volts, followed by a square wave kind of oscillation about the 4 volt level, gradually damping out. The alternative case, where the source impedance is high and the load impedance is low, results in a wave shape that rises in step-wise function from 0 to a certain voltage level in a series of ever decreasing steps. Either of these two situations will reflect back to the source, either the high or low impedance source, a feedback kind of noise which will detract from the integrity of the output wave shape and result usually in an increase in the time delay of several round trip times between the source output and the gate input for this circuit stage. In computer operaton, where operational speeds are presently measured in nanoseconds, such a delay can be critical and the feedback or signal oscillation could cause spurious operation of the circuit without the advantages of the present invention.

This kind of feedback problem can be avoided, however, by the fabrication onto the printed circuit board of a many pleated or accordian type of etched line which increases the impedance of the line in order to match the impedances of output and load. The input impedance, in fact, rises step by step through each turn of the etched accordian, and so, any output can theoretically be matched to any load simply by using the appropriate number of pleated etched lines. The mechanism of this impedance increase is that the field created by one line is in opposition to the field in the neighboring line, thereby increasing, step by step, the impedance of the total etch.

Each fold in what is called the transformer results in a discrete step in the wave shape. Therefore, in order to get a smooth wave shape, which is in fact the result desired, a many-folded transformer would be used.

DESCRIPTION OF THE DRAWINGS

For a more complete understanding of the invention, as well as other objects and further features thereof, reference may be had to the following detailed description of the invention in conjunction with the drawings wherein:

FIG. 9A and 9B are similar to FIGS. 7 and 8, except that the double folded line is connected to ground through a 15 ohm resistance.

DETAILED DESCRIPTION OF THE INVENTION

Figure 1A:
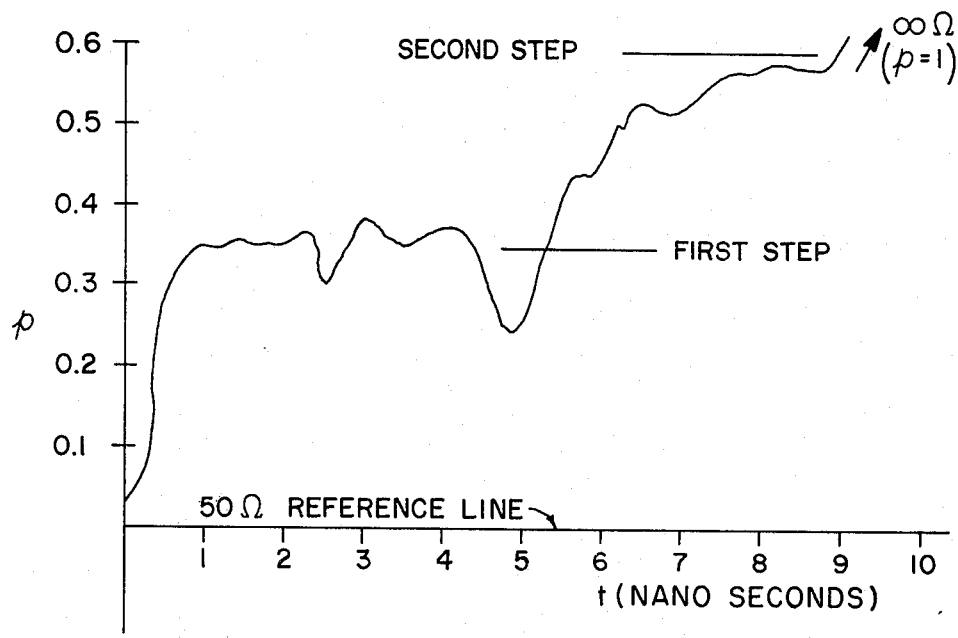
FIGS. 1A and 1B depict a curve representing the reflected voltage (or reflection coefficient) versus time and an actual microstrip/stripline configuration, respectively, wherein the signal line is open ended.
Figure 1B:
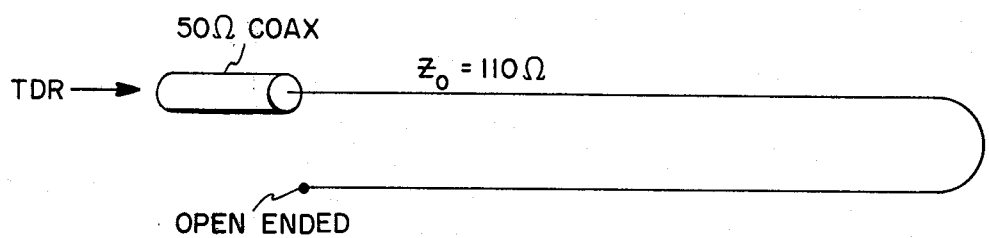

FIG. 1 of the present application shows the voltage waveform and the signal line in a test to show the feasibility of the present invention. As can be seen in FIG. 1B, a 50 ohm coax line is connected to a surface etched line, i.e., microstrip, signal line 8 inches in length, with one fold and another 8 inches parallel to itself to an open ended connection. The folded line being open ended indicates that the 50 ohm coax line would see an impedance approaching infinity. Connected to the input of the 50 ohm coax line, in this test, is a Time Domain Reflectometer (TDR) which is a product of the Hewlett-Packard Company. The TDR is a device which allows the measurement of reflection signals in a signal line and uses the 50 ohm coax line as a reflection reference; that is, there would be no reflection signal detected for a 50 ohm line that is terminated in 50 ohms. The vertical axis of FIG. 1A, $p$, indicates the reflection coefficient as follows:

$$p = \frac{V_{ref}}{V_{in}} = \frac{Z_R - Z_0}{Z_R + Z_0}$$

wherein $V_{ref}$ is the reflected voltage, $V_{in}$ is the incident voltage, which is a very fast step pulse of 250 mV from the TDR, $Z_0$ is the characteristic impedance of the line, and $Z_R$ is the load impedance. For purposes of discussion, at the vertical level indicated "second step" of FIG. 1A, six vertical scale units were observed and thus the reflection coefficient $p$ at this point in FIG. 1A is 0.6, which corresponds to an impedance of 200 ohms. The horizontal axis in FIG. 1A is the time axis t and in the experiment, the scale was 1 nanosecond per division. As shown in FIG. 1A, the time period of the second step is approximately 5 nanoseconds, which is also the round trip time for a signal propagating through an 8 inch line. This clearly shows that the folded back portion of the signal line has a virtual impedance of 200 OHMS, since the second step reaches a reflection coefficient P of 0.6 which as stated before corresponds to an impedance of 200 OHMS.

When the test voltage, about 250 mV, from the TDR is applied to the etched line, the reflected voltage back at the TDR is measured as seen in FIG. 1A. In the first nanosecond or so the reflection coefficient would rise to a value corresponding to the characteristic impedance of the line, then to 200 ohms due to the fact there is one fold in the etched line of FIG. 1B. The fact that there is a first step and a second step due to the fold in the line, shows that the step wise transformer action due to the fold is effective and is providing a more gradual transition between the source of 50 ohms and the load impedance approaching infinity. Of course, an open ended connection would normally have no function in an operating circuit, the difference between 50 ohms and infinite ohms dramatically shows the operation of the step-up transformer effect of the folded back surface etched lines in the first and second steps shown in the reflected voltage seen in FIG. 1A.

Figure 2A:
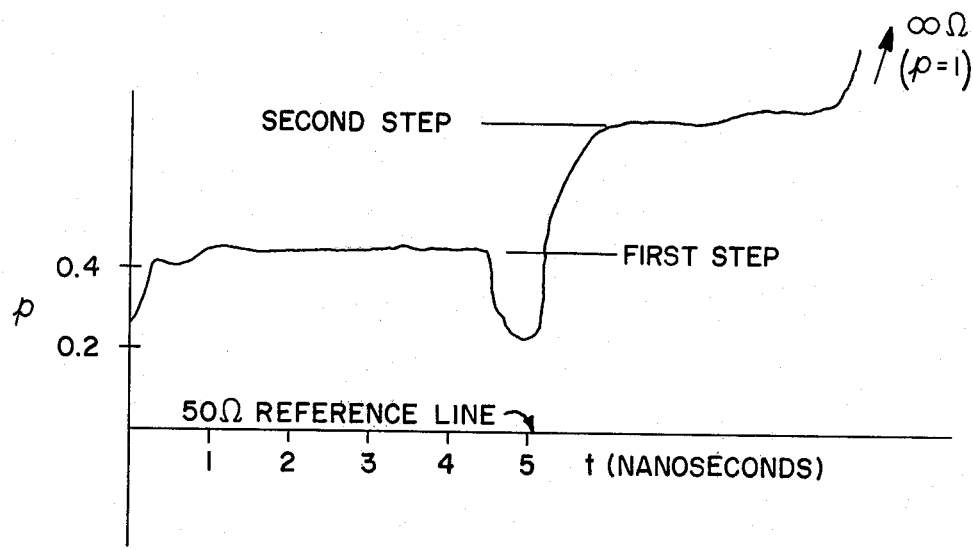
FIGS. 2A and 2B are similar to FIG. 1, except that the signal line used was different than that shown in FIG. 1.
Figure 2B:
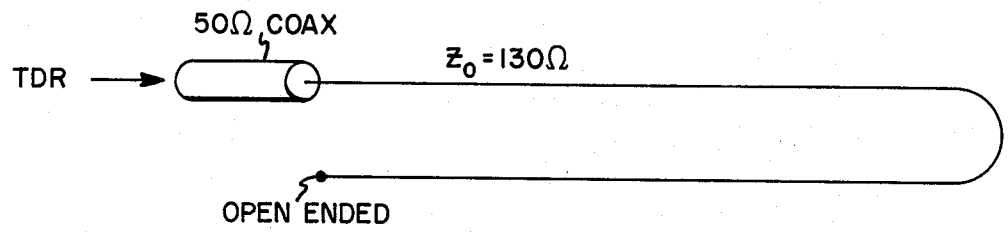

FIG. 2 shows the same experiment only using a different etched line, even though of the same configuration. It is seen that the reflected voltage coefficient at the TDR produces a two stepped curve showing the step-up transformer action of the etched line. The curves of FIGS. 1 and 2 are slightly different, however, due to the fact that the line in FIG. 1 had not been uniformly etched throughout the entire length in the etching process.

Figure 3A:
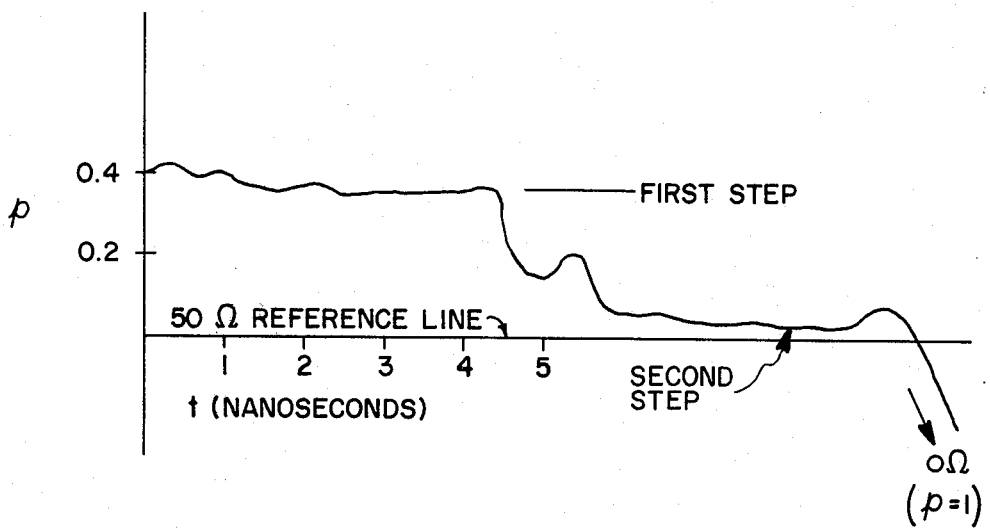
FIGS. 3A and 3B are similar to that in FIG. 2, except that the signal line is connected to ground potential.
Figure 3B:
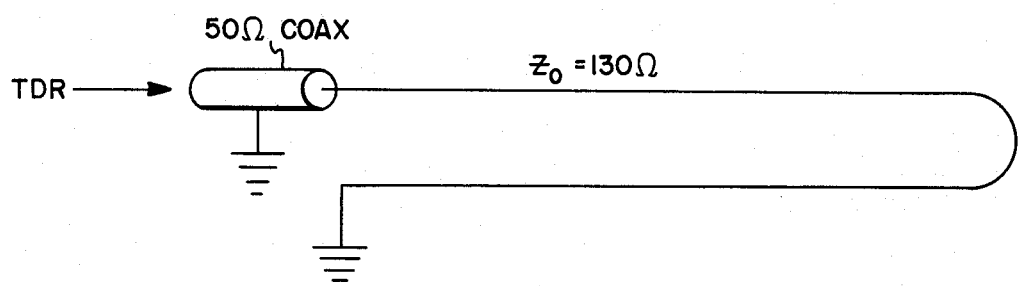

Referring now to FIGS. 3A and 3B, it can be seen in FIG. 3B that the TDR is connected to a 50 ohm coax line to a similar etched line as in FIGS. 1 and 2. In this instance, however, the end of the surface etched line is short circuited to ground as is the braid of the 50 ohm coax line. It should be noted here that the horizontal line seen in the figures do not denote a voltage step, as described above. That is, the horizontal axis line is not 0 on the vertical axis but indicates at the TDR when the reflected signal value on that line indicates a 50 ohm load. That is, as fully set forth above, the TDR will detect no reflection for a 50 ohm coax line when the line is terminated in 50 ohms. Thus, for the 50 ohm line connected to a load of 50 ohms, the signal will not reflect back, i.e., $p=0$. Since, however, in the tests shown in FIGS. 1 through 9, the signal lines are not connected to 50 ohms loads, the curve will be above or below, as appropriate, the 50 ohm reference line.

Returning to FIG. 3, when the TDR applies its incident voltage to the 50 ohm coax line, even though the line is connected directly to ground, there is reflected voltage on the line due to its characteristic impedance which, to the TDR, appears as a resistance as seen as the first step in FIG. 3A. This is due to the reflection before the fold at the right hand side of FIG. 3B. After the voltage reflection coefficient maintains itself at the first step, it rapidly decreases to a second step due to the line after the fold and then approaches the zero ohm level as it should over the long period due to the short circuit line. Thus, FIGS. 3A and 3B effectively show the stepdown transformer action of the single fold parallel etched lines from a 50 ohm source to a zero ohm load.

Figure 4A:
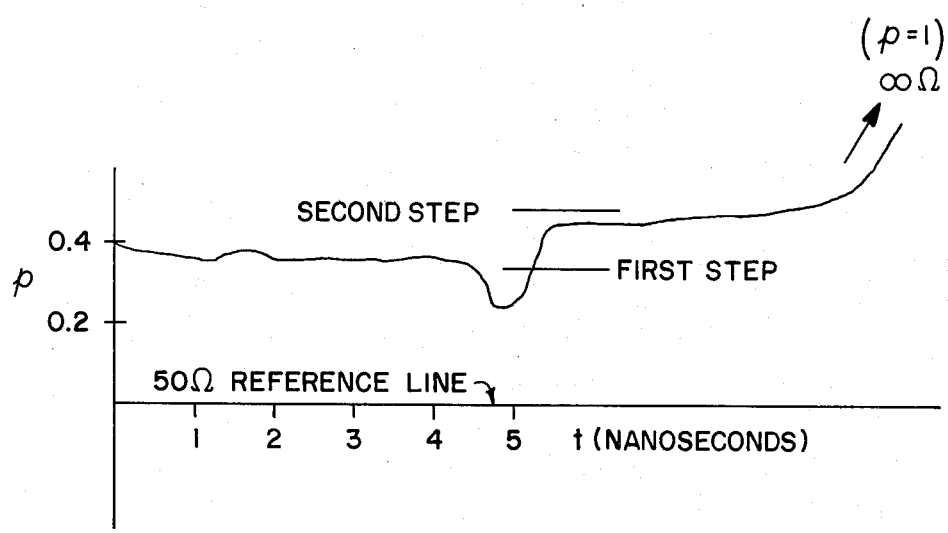
FIGS. 4A and 4B are similar to FIG. 2, except that the signal line is open ended with a ground line connected to ground potential.
Figure 4B:
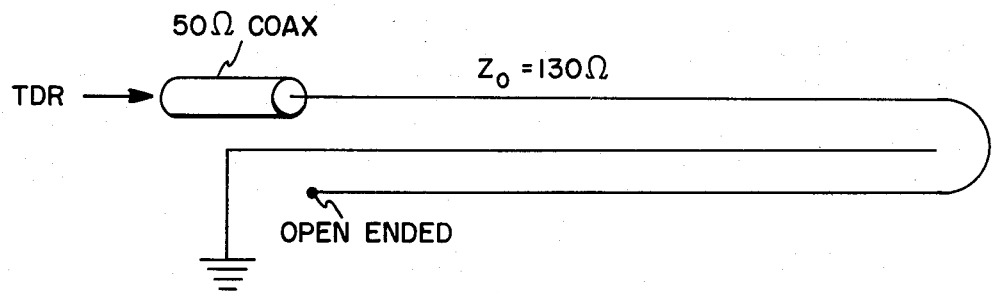

FIG. 4 shows the experiment utilizing the TDR supplied to a 50 ohm coax line which is connected to a folded etched line which is open ended as in FIGS. 1 and 2 but intermediate the folds is another etched line which is connected to ground. The grounded etched line affects the transformer action between the two legs of the, which may be grounded in any convenient manner to assure continuous grounding along the full length of the line, folded line as seem in FIG. 4A by decreasing the step size. The difference between the first step and the second step of the reflected voltage coefficient subsequent to the application of the reference voltage by the TDR is seen to be less dramatic and thus shows that the grounded etched line intermediate the two legs of the folded etched line provides a smoothing effect on the transition levels of the etched step-up transformer.

Figure 5A:
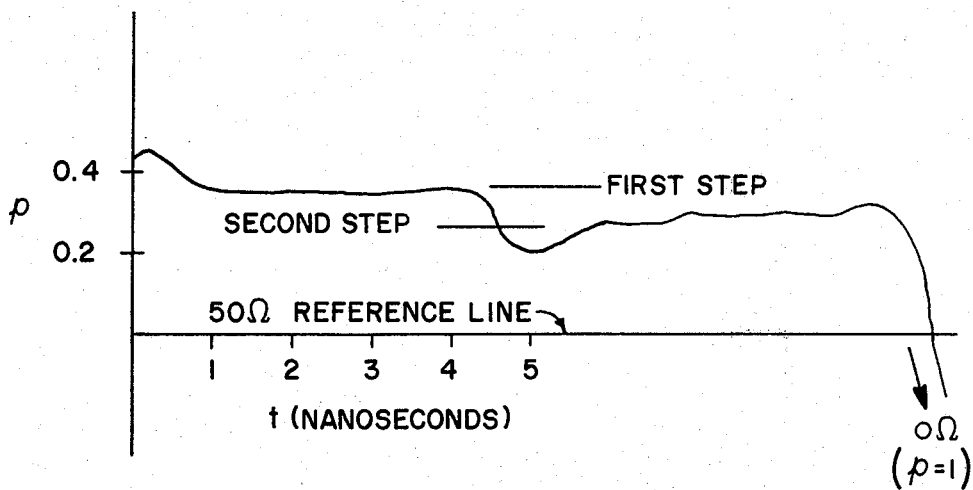
FIGS. 5A and 5B are similar to FIG. 4, except that the signal line and the ground line are both connected to ground potential.
Figure 5B:
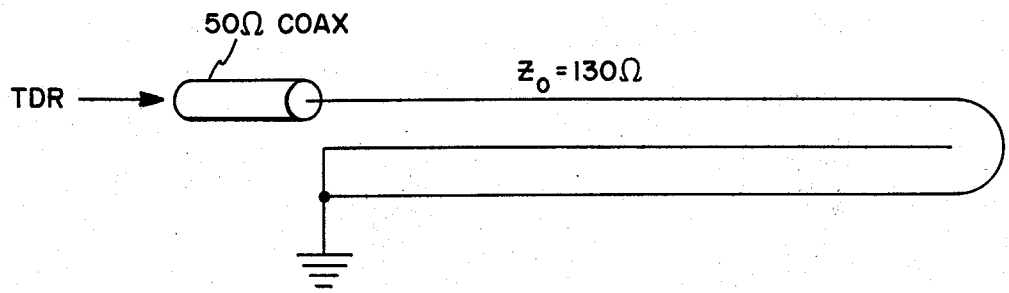

FIG. 5 shows a configuration very similar to that discussed above in FIG. 4, with the single exception that the second leg of the etched line is also connected to ground along with the grounded center line. In this instance, the load impedance appraoches zero, where it approached infinity in FIG. 4 and thus the voltage reflected should decrease instead of increasing as in FIG. 4. This is shown in FIG. 5A. Instantaneously, the reflected voltage coefficient reached a very high value and slowly but surely reaches the zero ohm level passing through the 50 ohm reference level in a first and second step arrangement.

Figure 6A:
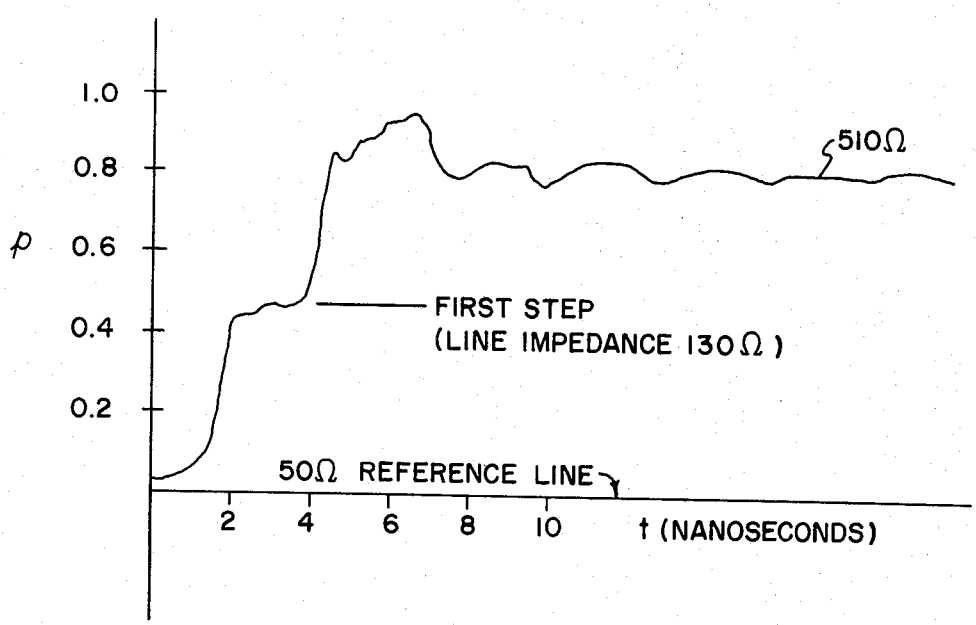
FIGS. 6A and 6B are similar to FIG. 2, except that there are no folds and the signal line is connected to ground through a 510 ohm resistance.

FIG. 6A shows the use of a single etched line with no folds but the line is now terminated in a 510 ohm resistance and then connected to ground. When the TDR is activated, the TDR would see the first level impedance of 130 ohms due to the line's characteristic impedance of 130 ohms. The second step would be a reflection, of course, from the 510 ohms which maintains itself at this level as, of course, the impedance is, in fact, 510 ohms. There is, however, no transformer action in this particular configuration and the voltage reflection configuration seen in FIG. 6A is rather sharp and distinct.

Figure 6B:
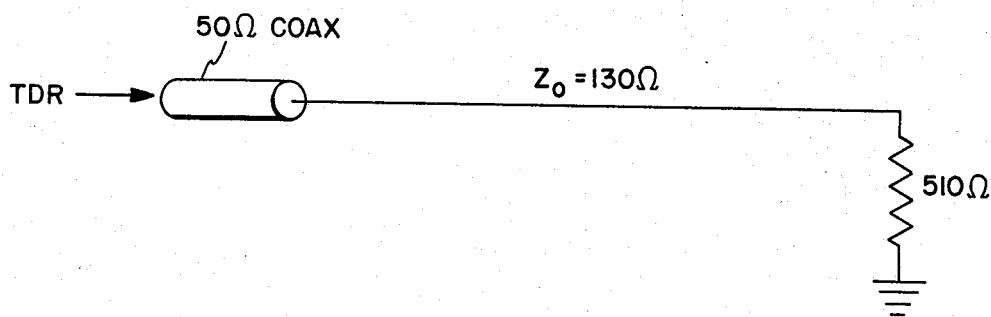
Figure 7A:
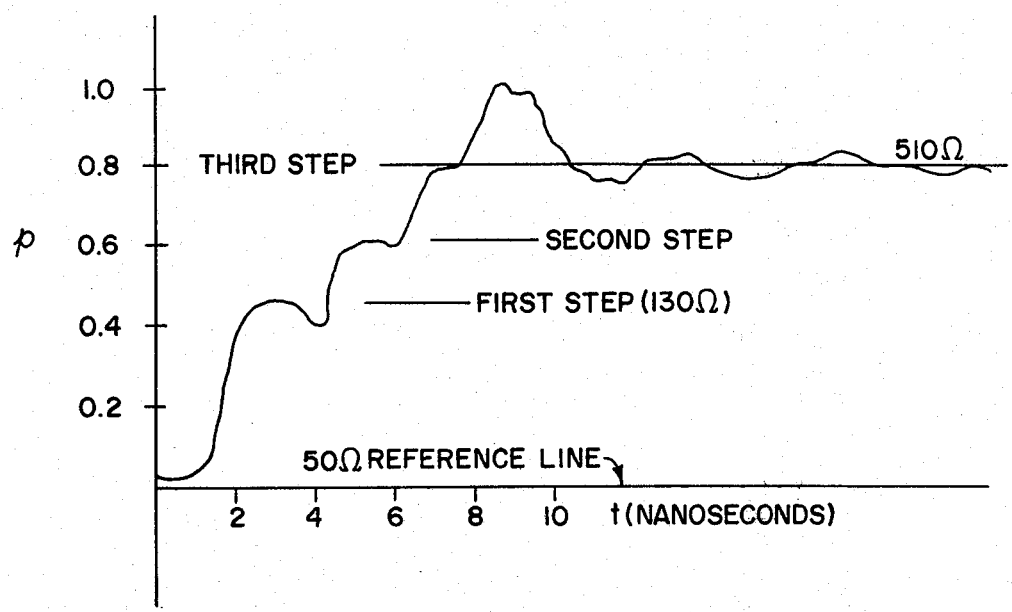
FIGS. 7A and 7B are similar to FIGS. 2 and 6, except that the signal line has two folds and is connected to ground through a 510 ohm resistance.
Figure 7B:
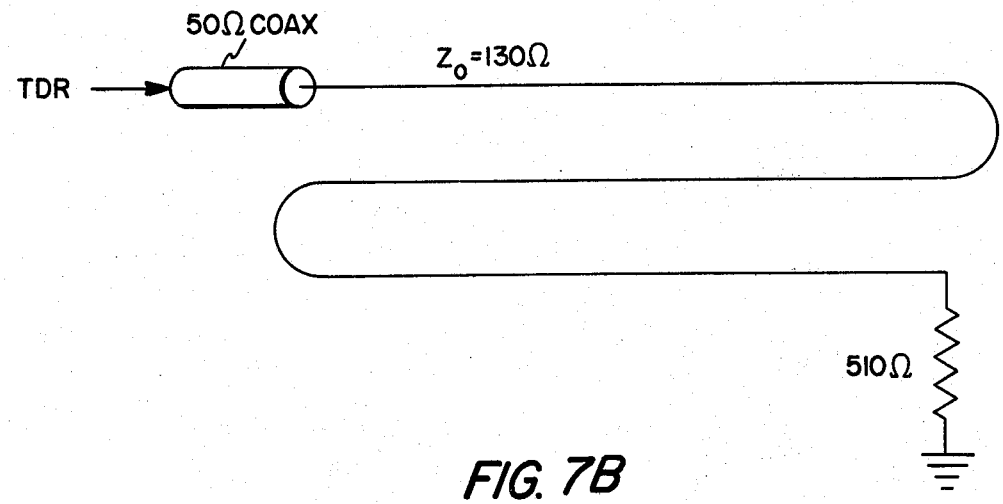

FIG. 7 shows the same TDR connected to a 50 ohm coax line which is now, however, connected to three parallel 8 inch leg etched lines with two folds. The end of the third leg is connected through a 510 ohm resistance to ground. As the TDR is activated, the reflection coefficient rises to the 130 ohm level by reason of the characteristic impedance of the etched line. The second and third steps of the curve show the effect of the two folds on the reflected voltage by smoothing out the transition between the 50 ohm source and the 510 ohm load. This figure shows the full advantage of the present invention in providing a transformer effect by more effectively matching the source to the load impedance. Here, as in FIG. 6, the horizontal time axis is now two nanoseconds per division or approximately 20 nanoseconds for the entire time period shown in the figure. The vertical axis remains the same, wherein the reflection coefficient $p$ equals 0.2 per division or approximately 1.2 overall.

Figure 8A:
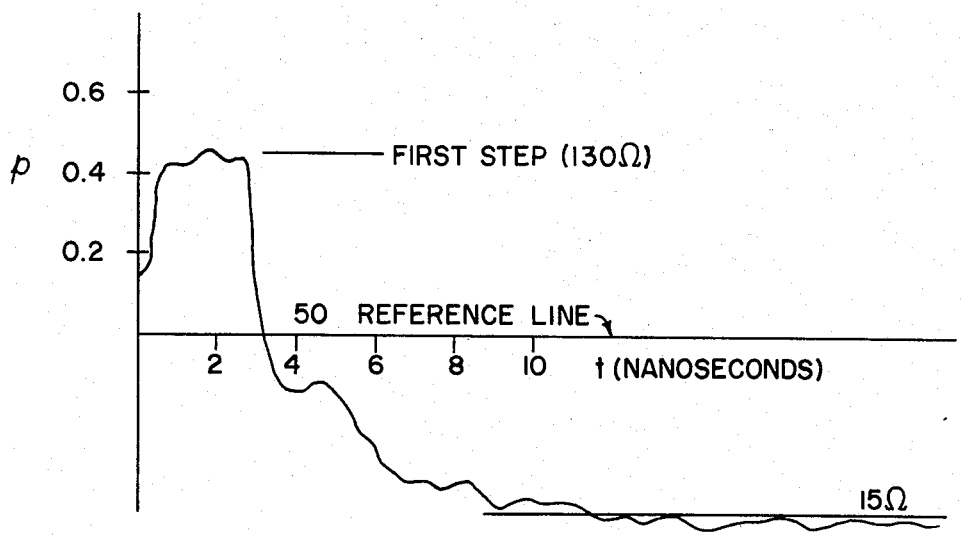
FIGS. 8A and 8B are similar to FIG. 6, except that the signal line is connected to ground through a 15 ohm resistance.
Figure 8B:
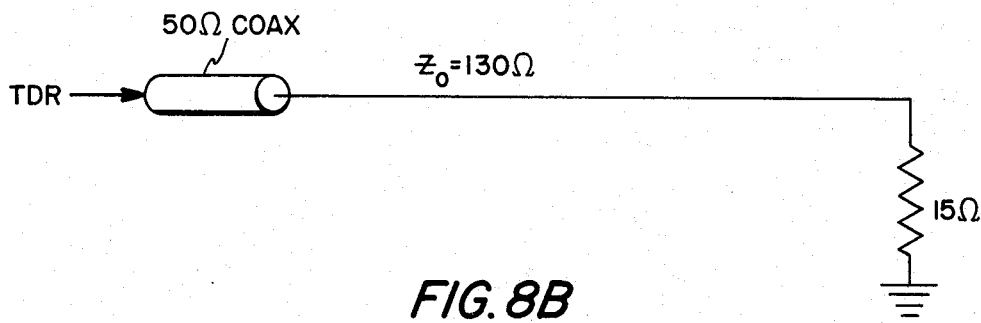

FIG. 8 shows a configuration very similar to that of FIG. 6 while the terminal impedance is now 15 ohms rather than 510 ohms. As the TDR is turned on, the reflected voltage rises very rapidly to the 130 ohm level due to the characteristic impedance of the line. However, the voltage coefficient drops rapidly to the 15 ohm level of the load impedance.

Figure 9A:
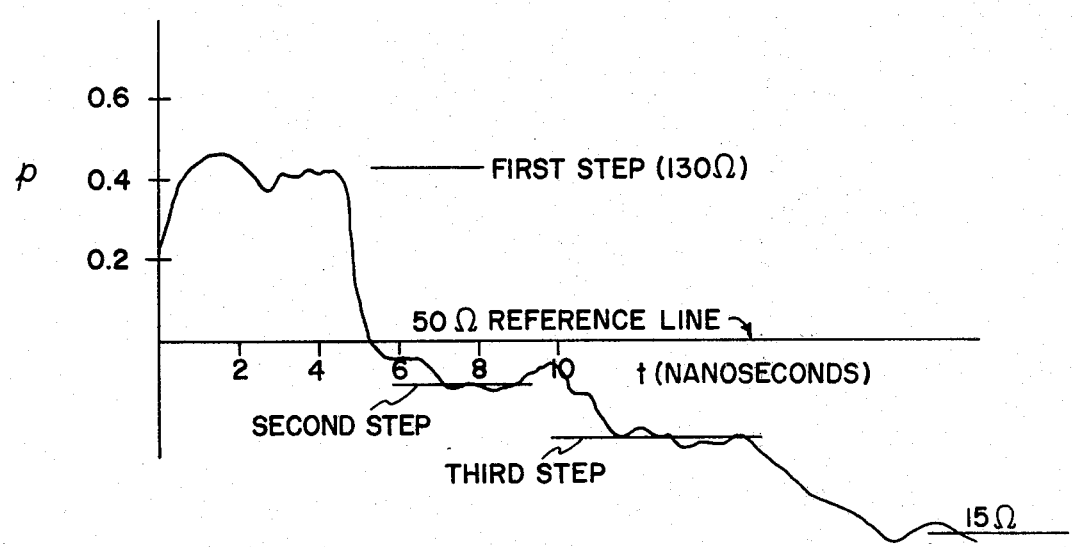
Figure 9A:
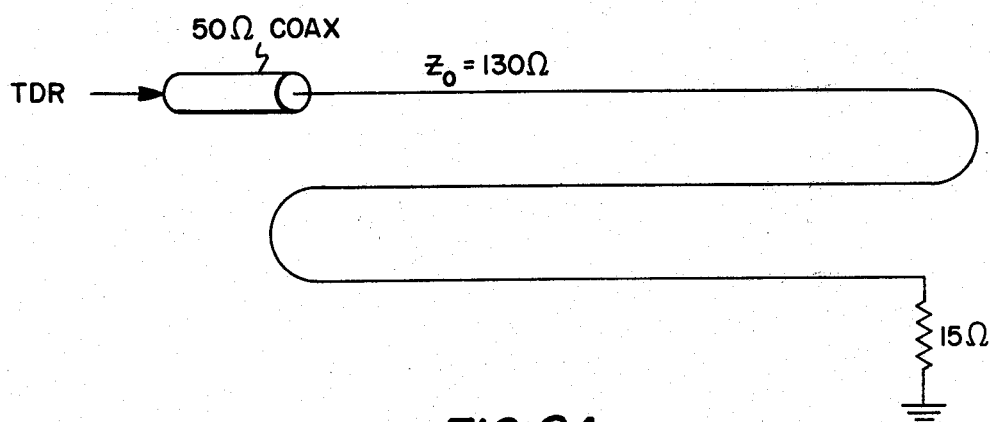

FIG. 9 shows the effect of putting two folds in the system instead of that seen in FIG. 8. The voltage rises rapidly to the first step of the characteristic impedance but the folds cause a more gradual transition from the 130 ohm characteristic impedance level to the 15 ohm impedance level of the load, showing that the step down transformer action is effective in providing impedance matching between unmatched load and source impedances. For example, in this instance, the folds would simulate two impedance level transitions of approximately 40 and 30 ohms, respectively, from the 130 ohms characteristic impedance of the line to the 15 ohm load impedance.

All the configurations shown and described in FIGS. 1 to 9 could be of microstrip or stripline configuration with similar results. While the step size is seen to be more gradual with the use of ground lines, the step size would also be affected, of course, by etched line dimension and spacing from one another. Also it can be seen that the more folds in the line, the more impedance steps and thus smoother transition from source to load impedance. The transformer effect in causing these impedance levels is, therefore, seen to be a vast improvement over prior art of variable width or tapered, etched lines without the fold, which because of physical limitations of the etching process is difficult and expensive to fabricate.

Figure 10:
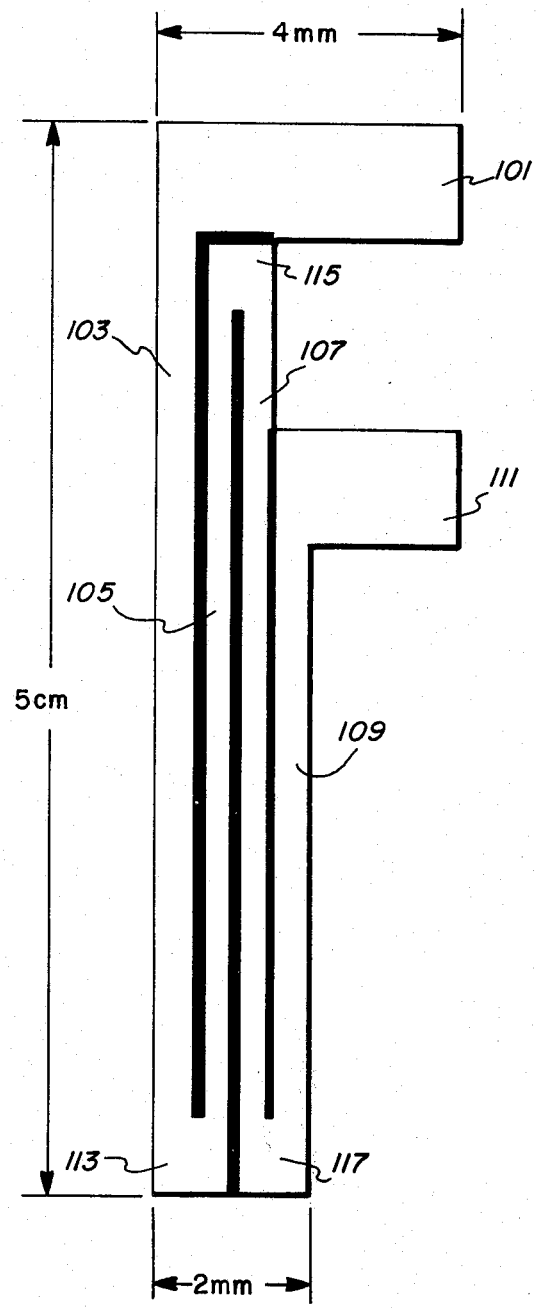
FIG. 10 is a microstrip/stripline transformer embodiment utilized on an actual circuit board.

FIG. 10 shows a greatly enlarged and out of scale depiction of an actual folded etched line impedance transformer utilizing the principles of the present invention. While the dimensions are correctly shown in the figure, for ease of description, the horizontal dimension of 4 millimeters is greatly expanded over that of the vertical dimension of 5 centimeters. The configuration shown could be a copper layer on a printed circuit board, the black perimeters and lines shown therein would be etched away so there would be no electrical connection between the various legs of the transformer seen in FIG. 10. The input and output points of the transformer are shown at 101 and 111. 101 could be the input to the transformer or the output, similarly with terminal 111. These points could be connected to further circuitry on a printed circuit board by any of the well known soldering or other connection techniques. Assuming, for example that terminal 101 is the input, such input is connected to leg 103 and the legs parallel thereto are legs 105, 107 and 109 which is connected to output terminal 111. Fold 113 couples legs 103 to 105, fold 115 couples leg 105 to 107, while fold 117 couples leg 107 to 109. The impedance transformer shown in this figure would be formed at the same time the entire printed circuit board is generated in the etching process. That is, when the board goes through the etching process to etch away undesirable copper or other electrical conduction material for the other circuit components on the board, the black lines intermediate legs 103, 105, 107 and 109 would also be etched away so that the microstrip transformer would be generated as shown.

Figure 11A:
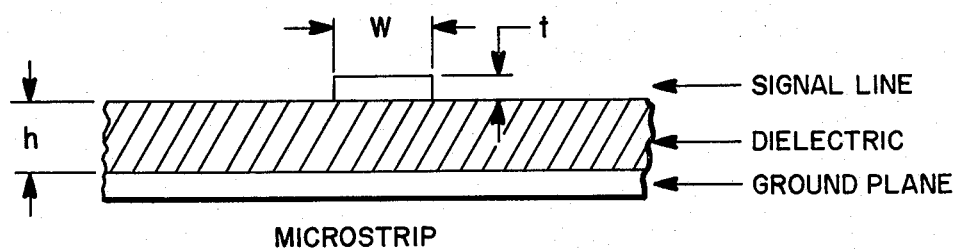
FIGS. 11A and 11B show a cross-sectional area of a typical circuit board showing the microstrip and stripline configurations.

FIG. 11A shows a partial cross sectional view of a typical microstrip line. That is, the printed circuit board would be made of any of the dielectrics utilized for printed circuit boards such as plastic, fiberglass or glass epoxy. The printed circuit board shown in FIG. 11A has a height of any desirable choice designated $h$. The signal line indicated of a width $w$ and thickness $t$ would be caused by the etching away of surrounding conduction material by any of the etching techniques known in the art such as photo-resist or acid development. On the bottom of the dielectric or printed circuit board is the ground plane conductive surface which is utilized for coupling to ground any spurious signals which could cause erratic operation of the components on the circuit board and also provides a returning path for the signal current.

Figure 11B:
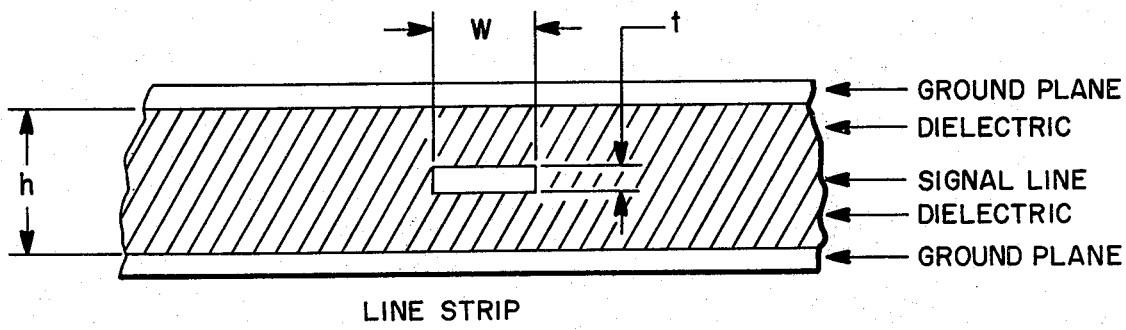

FIG. 11B shows a stripline configuration where the signal line is caused to form inside the dielectric, such as by using a multi-layer board wherein each layer is formed and the layers joined together in a multi-layer fashion. Thus, in FIG. 11B, the signal line of height $t$ and width $w$ is within the dielectric with a ground plane above and below the surface of the dielectric which is of a height $b$.

Figure 12:
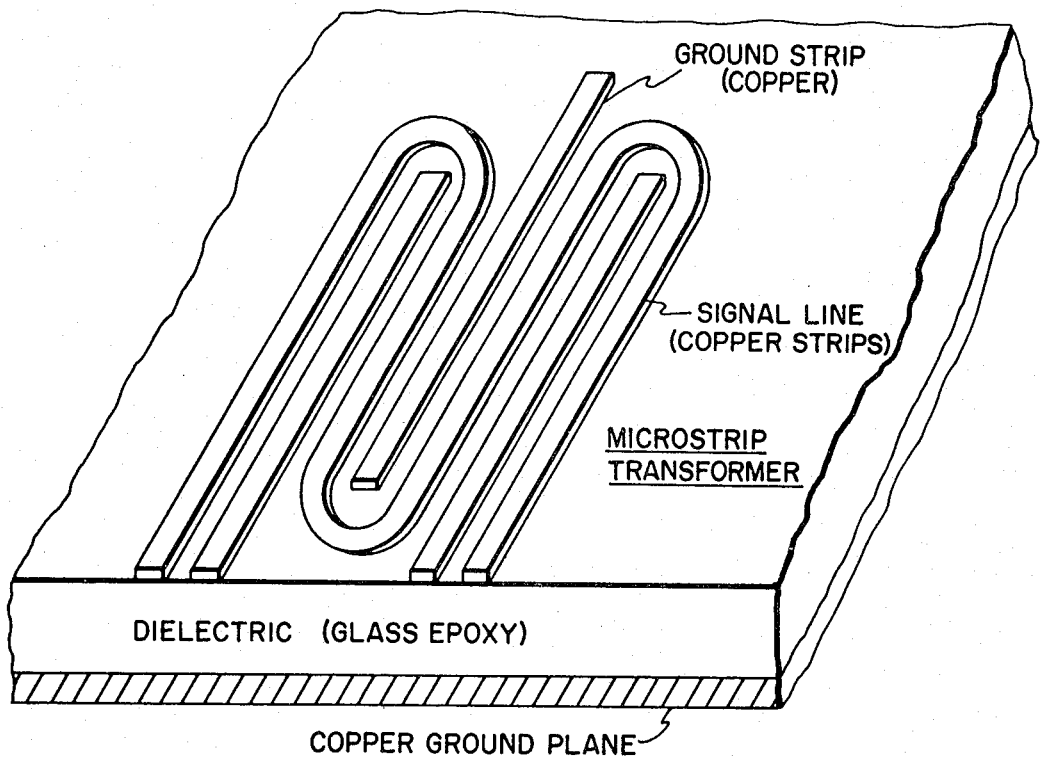
FIG. 12 shows an embodiment of a microstrip transformer on a printed circuit board.

FIG. 12 shows an isometric view of a typical microstrip transformer signal line of copper strips on a dielectric surface with a copper ground plane below. Intermediate the three folds of the microstrip signal line transformer are three ground strips which were described in conjunction with FIGS. 4 and 5, for example.

Figure 13:
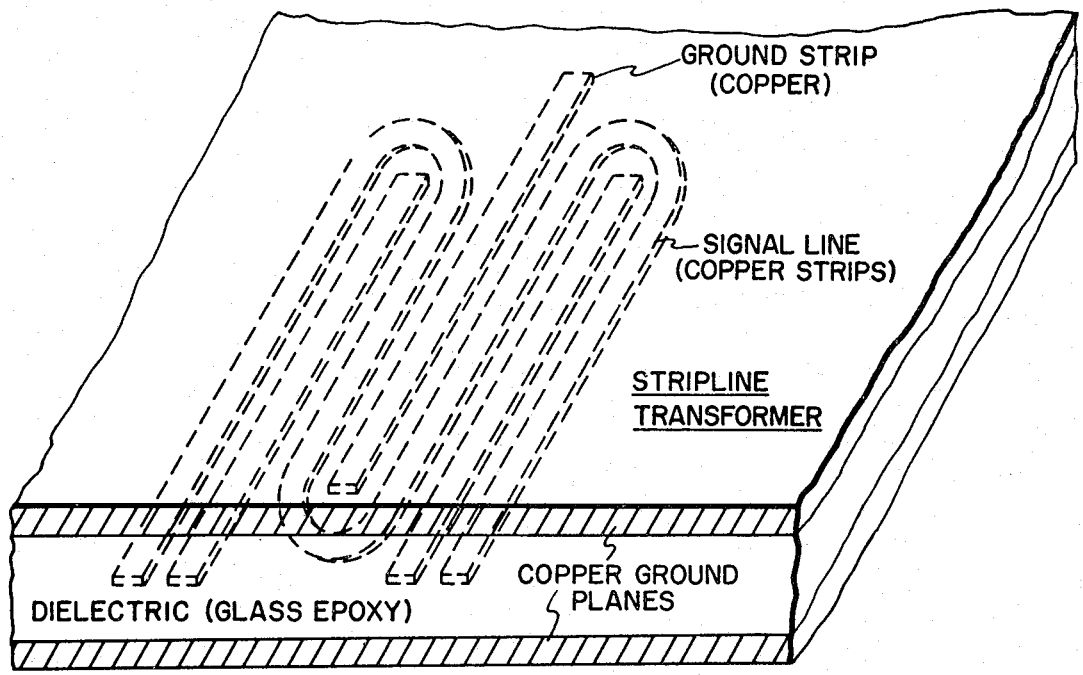
FIG. 13 shows an embodiment of a stripline transformer configuration in a printed circuit board.

FIG. 13 is an isometric configuration of a stripline signal line transformer wherein the folded signal line with intermediate ground strips is shown internal to the dielectric of a printed circuit board with upper and lower grounds planes.

Typical dimensions for a microstrip transformer in FIG. 12 would have the thickness of each etched signal line at 0.0014 inches with the width at 0.008 inches. The height of the dielectric or glass epoxy surface could be 0.024 inches with the thickness of the ground plane copper conductor at 0.0020 inches. Typical dimensions of the stripline transformer seen in FIG. 13 would be similar to that of FIG. 12 wherein the thickness of each copper stripline signal line could be 0.0014 inches, the width at 0.008 inches. The dielectric thickness could be 0.024 inches with each copper ground plane at a thickness of 0.0020 inches.

The stripline/microstrip transformer could be typically used for connecting clock lines on a printed circuit board or from one circuit component to another circuit component of differing source and load impedances. The rise time of a TTL circuit is a function of the load impedance and the source output resistance of the output stage. For example, the load impedance is about 1400 ohms and the source impedance is about 200 ohms for a 1 state. For very short lines, the voltage at either end of the line will rise directly to the high level. For long lines, the voltage at the source output will rise to a level approximated by the voltage divider of the characteristic impedance of the transmission line and source output resistance. For a line with typical characteristic impedance, say 75 ohms, this is much lower than the normal high level. The output will remain at this level until the reflection from the end of the line returns and brings the output to a full high level. The load impedance will be decreased if there are large fan outs at the end of the line. In the latter case, it may take many reflections to bring the source output to its full high level. Thus, any gates close to the source on a long line may suffer additional time delay to rise up to the high level. This phenomenon is called the pedestal effect. Thus, in the case where there is only limited drivers but with many loads, the following configurations should be avoided, (1) many gates radially connected to the source, and (2) loads clustered at one or few points. The only case left is an approximately uniform layout on a long line. However, this causes long delay at the source end because of the pedestal effect. The microstrip/stripline impedance transformer of the present invention can be used in this case to decrease the time delay.

Thus, while the invention has been described with reference to specific embodiments, it will be understood by those skilled in the art that various changes may be made and equivalents may be substituted for elements thereof, without departing from the true spirit and scope of the invention. In addition, many modifications may be made to adapt to a particular situation without departing from the essential teachings of the invention.

What is claimed is:

1. For use on a printed circuit board having a ground plane, at least one source circuit component with an output of a given impedance level, and at least one load circuit component with an input of a given impedance level, an impedance transformer for step-wise transformation comprising:

a continuous etched conducting line on said printed circuit board, said line being of substantially constant width and substantially constant distance from said ground plane, and having first and second end points, said first end point being connected to the output of said source component, and said second end point being connected to the input of said load component, said line further having a number of folds forming a number of parallel legs of desired length, said number of folds and said number of legs being dependent on the number of transformation steps desired between said source output impedance level and said load input impedance level when the field created during signal conduction by a leg on one side of said fold is in opposition to the field created by a leg on the other side of said fold to step-up or step-down the impedance of said line, and a number of grounded etched conducting lines, each one of said grounded lines being positioned intermediate and electrically insulated from said parallel legs and being extended along substantially the entire length of said legs to produce a smoother impedance transition in said impedance transformer.

2. The impedance transformer of claim 1 wherein said etched conducting lines are of a microstrip surface etched configuration.

3. The impedance transformer of claim 1 wherein said etched conducting lines are of a stripline buried etched configuration.

4. In a printed circuit board having a ground plane, at least one source circuit component with an output of a given impedance level, and at least one load circuit component with an input of a given impedance level wherein a conducting line is etched on said board, an impedance transformer for step-wise transformation comprising:

at least a first fold on said line forming in said line at least first and second legs of substantially the same width and substantially the same distance from said ground plane, said second leg being folded back along said first leg in a parallel direction, the mutual coupling of said first and second legs causing a step-up or step-down impedance transition in said line depending upon the impedance levels of the circuit components connected to the respective ends of said line, and a second grounded etched conducting line on said printed circuit board intermediate and electrically insulated from said first and second legs of said line, and extending along substantially the entire length of said legs to produce a smoother impedance transition in said impedance transformer.

5. The impedance transformer of claim 4 wherein said conducting lines are surface etched on said board.

6. The impedance transformer of claim 4 wherein said conducting lines are buried etched on said board.

7. In a printed circuit board, having a ground plane, at least one source circuit component with an output of given, impedance level, and at least one load circuit component with an input of a given impedance level, wherein a conducting line is etched on said board, an impedance transformer for step-wise transformation comprising:

at least a first fold in said conducting line for effecting said line to be configured in at least a first and second leg of substantially the same width and substantially the same distance from said ground plane, said first and second legs being formed in a parallel configuration, said parallel configuration of said legs causing the field generated during signal conduction in said line to be in opposition in said first and second legs to cause an impedance transition in said line, and a second grounded etched conducting line on said printed circuit board intermediate and electrically insulated from said first and second legs of said line, and extending along substantially the entire length of said legs to produce a smoother impedance transition in said impedance transformer.

8. The impedance transformer of claim 7, further including in said line at least a third leg of substantially the same width and substantially the same distance from said ground plane as all other legs, said third leg being formed to run in parallel to said first and second legs, said third leg causing the field generated during signal conduction in said line to be in opposition to that of said second leg to cause at least a second impedance transition in said line.

9. The impedance transformer of claim 8 wherein said etched conducting lines are a microstrip line.

10. The impedance transformer of claim 8 wherein said etched conducting lines are a stripline line.

11. The impedance transformer of claim 7 wherein the impedance transformer is a step up transformer when the load impedance coupled to said line is higher than the source impedance coupled to the other end of said line.

12. The impedance transformer of claim 7 wherein the impedance transformer is a step down transformer when the source impedance coupled to said line is higher than the load impedance coupled to the other end of said line.

13. In the fabrication of an impedance transformer for step-wise transformation by means of an etched line on a printed circuit board, having, a ground plane, the steps comprising:

effecting at least a first fold in said line to form in said line at least first and second legs, of substantially the same width and substantially the same distance from said ground plane, forming said second leg in a parallel direction back along said first leg so that the field generated during signal conduction in said line is in opposition in said first and second legs to cause an impedance transition in said line, and forming a second grounded etched conducting line intermediate and electrically insulated from said first and second legs of said line, and extending along substantially the entire length of said legs, to produce a smoother impedance transition in said impedance transformer.

14. The method as set forth in claim 13 further including effecting at least a second fold in said line to form in said line at least a third leg of substantially the same width and substantially the same distance from said ground plane as all other legs, forming said third leg in a parallel direction back along said second leg so that the field generated during signal conduction in said line is in opposition to that of said second leg to cause at least a second impedance transition in said line.

15. The method as set forth in claim 14 further including forming said etched lines by a stripline etching process.

16. The method as set forth in claim 14 further including forming said etched lines by a microstrip etching process.

* * * * *